(12) United States Patent
Sen et al.

(10) Patent No.: US 8,067,987 B2
(45) Date of Patent: Nov. 29, 2011

(54) MILLIMETER-WAVE WIDEBAND VOLTAGE CONTROLLED OSCILLATOR

(75) Inventors: Padmanava Sen, Atlanta, GA (US);
Saikat Sarkar, Atlanta, GA (US);
Stephane Pinel, Atlanta, GA (US); Joy Laskar, Marietta, GA (US); Francesco Barale, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 40 days.

(21) Appl. No.: 12/682,352

(22) PCT Filed: Oct. 10, 2008

(86) PCT No.: PCT/US2008/079500
§ 371 (c)(1),
(2), (4) Date: Apr. 9, 2010

(87) PCT Pub. No.: WO2009/049143
PCT Pub. Date: Apr. 16, 2009

(65) Prior Publication Data
US 2010/0214026 A1    Aug. 26, 2010

Related U.S. Application Data

(60) Provisional application No. 60/978,865, filed on Oct. 10, 2007, provisional application No. 60/978,804, filed on Oct. 10, 2007.

(51) Int. Cl.
*H03L 7/00* (2006.01)
(52) U.S. Cl. .......... 331/2; 331/117 V; 331/46; 331/167; 331/117 R; 331/117 FE; 331/179; 455/260; 327/156

(58) Field of Classification Search ................ 331/2, 46, 331/177 V, 167, 117 R, 117 FE, 179; 327/156; 455/260
See application file for complete search history.

(56) References Cited

U.S. PATENT DOCUMENTS

| | | | |
|---|---|---|---|
| 4,347,484 A | 8/1982 | Vandegraaf | |
| 7,026,883 B2 * | 4/2006 | Muthali et al. | 331/183 |
| 7,116,180 B2 | 10/2006 | Hamaguchi et al. | |
| 7,304,548 B2 * | 12/2007 | Lee et al. | 331/117 FE |
| 2005/0212604 A1 | 9/2005 | Cyr et al. | |
| 2006/0103475 A1 | 5/2006 | Hofer | |
| 2006/0226923 A1 | 10/2006 | Veenstra et al. | |
| 2007/0103240 A1 | 5/2007 | Staszewski et al. | |
| 2007/0105504 A1 | 5/2007 | Vorenkamp et al. | |

OTHER PUBLICATIONS

International Search Report and Written Opinion dated Dec. 18, 2008 for related PCT Application No. PCT/US2008/079500.

* cited by examiner

*Primary Examiner* — Arnold Kinkead
(74) *Attorney, Agent, or Firm* — Ryan A. Schneider, Esq.; Troutman Sanders LLP

(57) ABSTRACT

A voltage controlled oscillator-phase lock loop (VCO-PLL) system includes a voltage controlled oscillator (VCO) system implementing four-channel architecture, such that two bands support two channels; a phase-locked-loop (PLL) system; and a mixer system. The VCO system further includes a control circuit; a first cross-coupled oscillator system adapted to receive a source voltage; a second cross-coupled oscillator system adapted to receive the source voltage; and a plurality of isolation buffer systems adapted to protect the first and second cross-coupled oscillator systems.

17 Claims, 13 Drawing Sheets

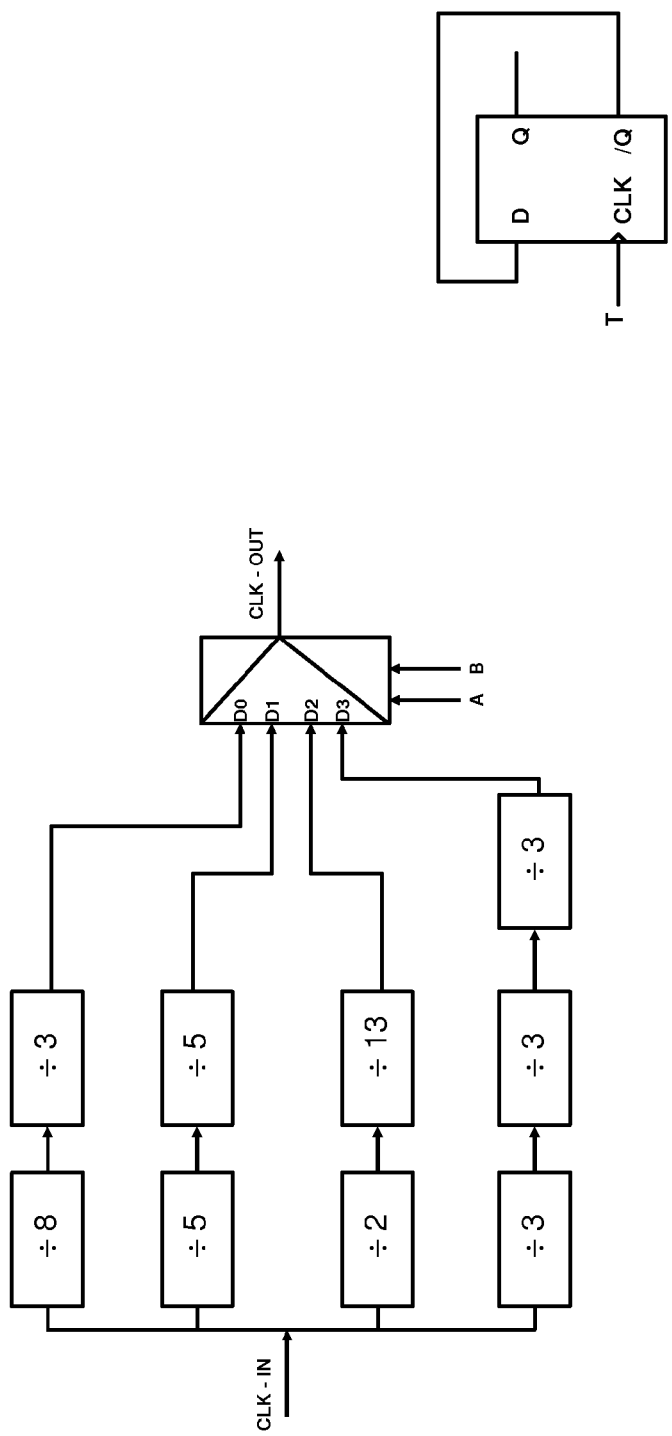
*Fig. 11*
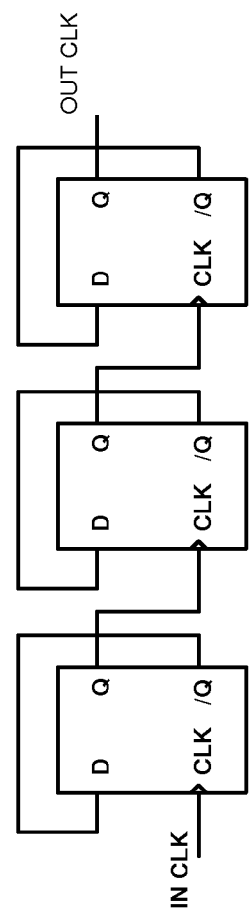
*Fig. 12A*
*Fig. 12B*

MILLIMETER-WAVE WIDEBAND VOLTAGE CONTROLLED OSCILLATOR

CROSS REFERENCE TO RELATED APPLICATIONS

This application is a national stage application and claims benefit of priority under 35 U.S.C. §371 of International Application No. PCT/US2008/079500 filed on 10 Oct. 2008, which claims benefit under 35 U.S.C. §119(e) of U.S. Provisional Patent Application Nos. 60/978,804 and 60/978,865, both filed 10 Oct. 2007, the entire contents and substance of which are hereby incorporated by reference as if fully set forth below.

BACKGROUND

Embodiments of the present invention relate to a voltage controlled oscillator (VCO). In particular, embodiments of the present invention relate to a millimeter-wave wideband VCO system implemented in CMOS (complimentary metal oxide semiconductor).

There is a tremendous potential in terms of multi-gigabit wireless transmission using the unlicensed frequency-band—i.e., approximately 57-64 GHz (Giga-Hertz) in the United States and approximately 59-64 GHz worldwide—for high-speed data transfer between storage devices, point-to-point video, HDTV, wireless personal area networking (WPAN) applications, and the like.

For a low-cost CMOS implementation, it is difficult to achieve approximately 7-8 GHz tuning range using a single VCO along with a single varactor. The varactors commercially-available in CMOS are usually MOS varactors and, hence, the capacitance range is approximately less than 100% of the desired average value. Further, noise performances of large-sized varactors tend to perform poorly. Both the increased size of varactor and the reduced length of tuning inductor demand a better design to achieve the desired multi-channel wide band operation.

Many known design options fail to provide the needed multi-channel wide band solution. For example, a switched-varactor system (as shown in FIG. 1), a switched-inductor system, and an active-inductor-based VCO system enable multi-band operations. Unfortunately, these designs are limited to an operating frequency of a maximum of 10-20 GHz.

For instance, switched-inductor topology is not possible, because of increased switch loss, high switching capacitance for proper band switching, and low-Q resonance. Switched-varactor solutions (again, for example, as illustrated in FIG. 1) are difficult to implement in CMOS technologies; for instance, at greater than approximately 50 GHz, off-state capacitances inject noises and reduce the required tuning length. In fact, the switched-varactor solution is quite similar to a single VCO with a large varactor and, as a result, has the same disadvantages; specifically, the output power, reliability, and phase noise are sacrificed to obtain a simpler and more compact solution.

SUMMARY

Briefly described, in an exemplary embodiment, the present invention relates to a voltage controlled oscillator-phase lock loop (VCO-PLL) system. In an exemplary embodiment, the VCO-PLL system includes a voltage controlled oscillator (VCO) system implementing four-channel architecture, such that two bands support two channels each; a phase-locked-loop (PLL) system; and a mixer system. The VCO system further includes a control circuit; a first cross-coupled oscillator system adapted to receive a source voltage and adapted to generate a first signal; a second cross-coupled oscillator system adapted to receive the source voltage and adapted to generate a second signal; and a plurality of isolation buffer systems adapted to protect the first and second cross-coupled oscillator systems. Advantageously, the buffer systems eliminate the need for switches between the first and second cross-coupled oscillators.

These and other objects, features and advantages of the present invention will become more apparent upon reading the following specification in conjunction with the accompanying drawing figures.

BRIEF DESCRIPTION OF THE DRAWINGS

FIG. 11 is a block diagram of a programmable frequency divider system, in accordance with an exemplary embodiment of the present invention.

FIG. 12A is a schematic of a toggle flip-flop for a divide-by-2 divider circuit, in accordance with an exemplary embodiment of the present invention.

FIG. 12B is a schematic of a cascaded toggle flip-flop divide-by-8 divider circuit, in accordance with an exemplary embodiment of the present invention.

DETAILED DESCRIPTION

Figure 1:
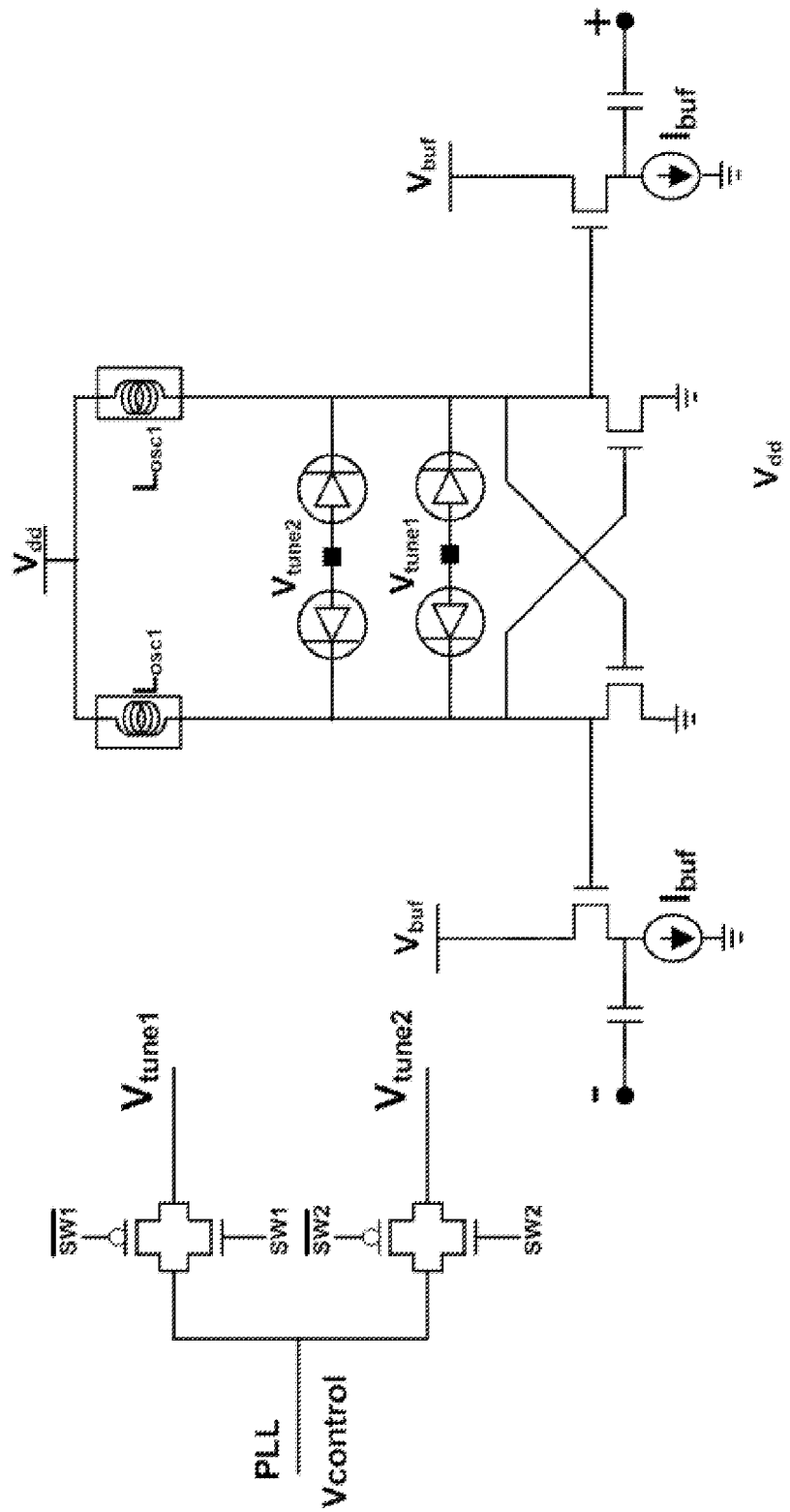
FIG. 1 is a schematic of a conventional switched-varactor design.

To facilitate an understanding of the principles and features of various embodiments of the present invention, they are explained hereinafter with reference to their implementation in an illustrative embodiment. In particular, an illustrative embodiment of the invention is described in the context of being a voltage controlled oscillator (VCO) system, as well as a VCO connected to a phase-locked-loop (PLL).

Embodiments of the invention are not, however, limited to a VCO-PLL. Embodiments of the present invention can be used to provide a PLL with or without a VCO, and a VCO with or without a PLL.

The materials and components described hereinafter as making up the various elements of the present invention are intended to be illustrative and not restrictive. Many suitable materials and components that would perform the same or a similar function as the materials and components described herein are intended to be embraced within the scope of the invention. Further, such other materials not described herein can include, but are not limited to, materials that are developed after the time of the development of the invention, for example.

Referring now to the figures, wherein like reference numerals represent like parts throughout the view, embodiments of the present invention will be described in detail.

Figure 2:
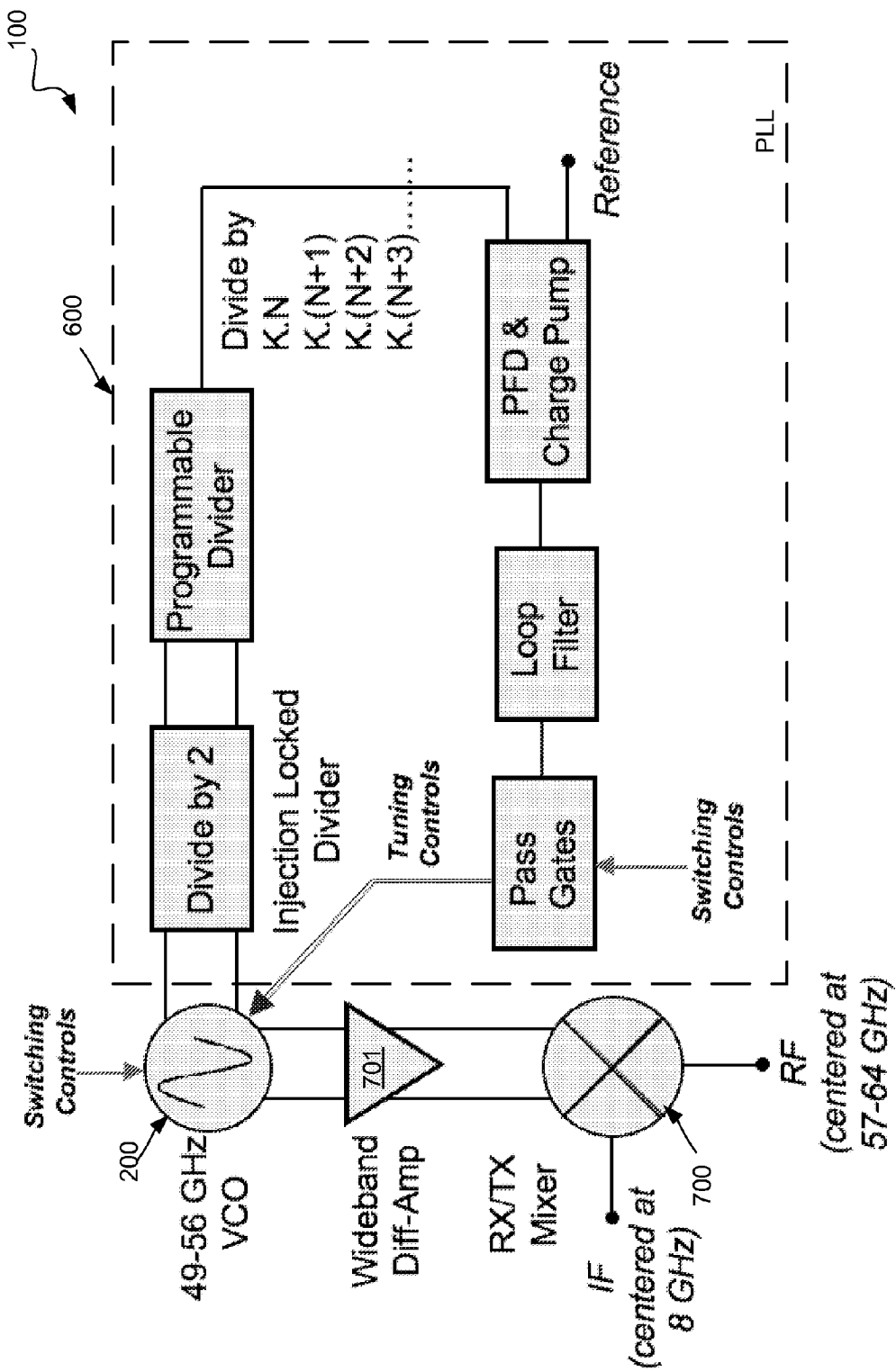
FIG. 2 is a block diagram of a voltage controlled oscillator-phase lock loop (VCO-PLL) system, in accordance with an exemplary embodiment of the present invention.
Figure 3A:
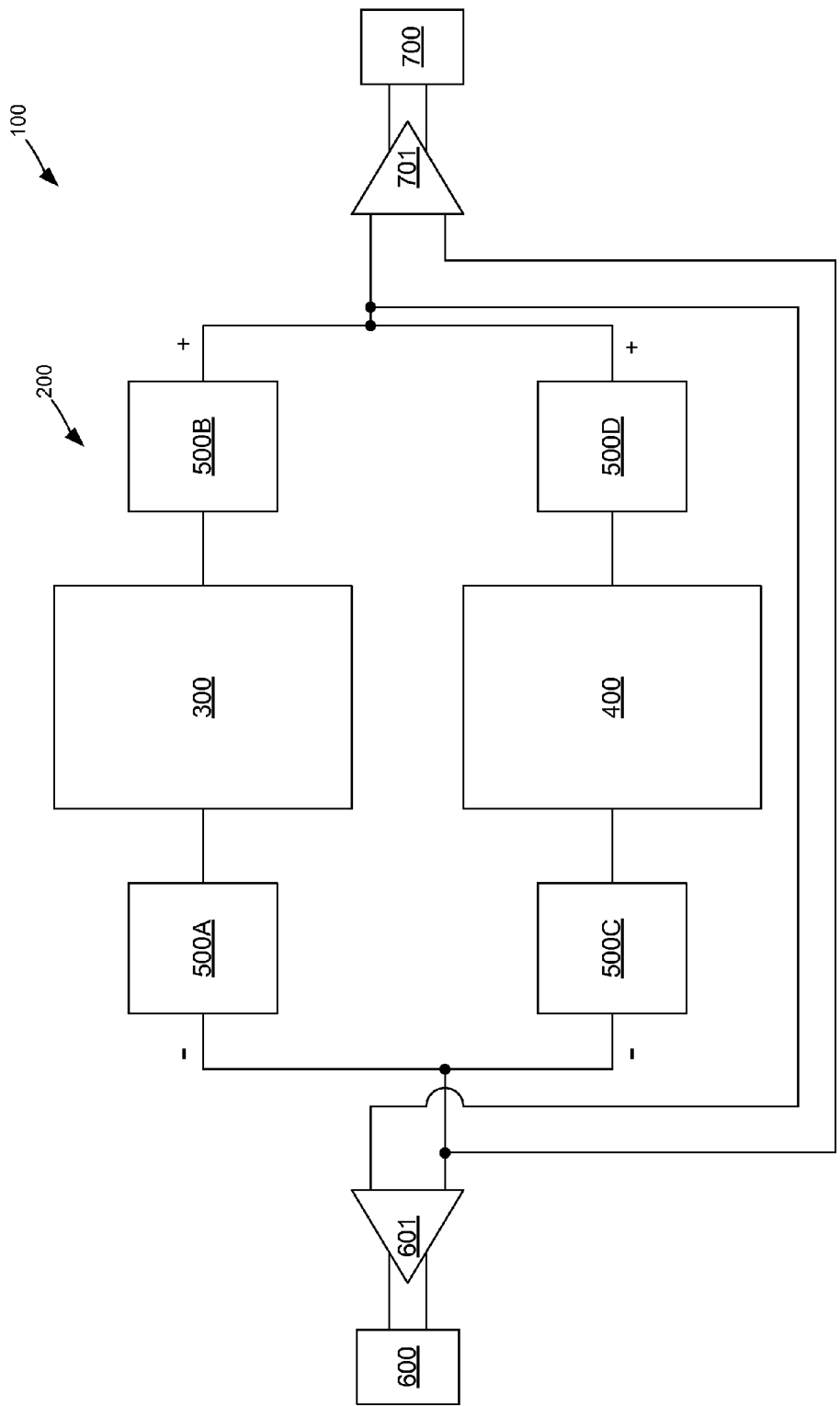
FIG. 3A is another block diagram of the VCO-PLL system, in accordance with an exemplary embodiment of the present invention.

As illustrated in the block diagrams of FIGS. 2 and 3A, embodiments of the present invention relate to a VCO-PLL (voltage controlled oscillator-phase lock loop) system 100. The VCO-PLL system 100 includes a VCO system 200, a PLL system 600, and a mixer system 700. The VCO-PLL system 100 can be implemented in CMOS, e.g., 90 nm CMOS technology. In an exemplary embodiment, the VCO-PLL system 100 can be implemented in CMOS, such that it is independent of the performance on MOS switches at higher frequencies.

Figure 3B:
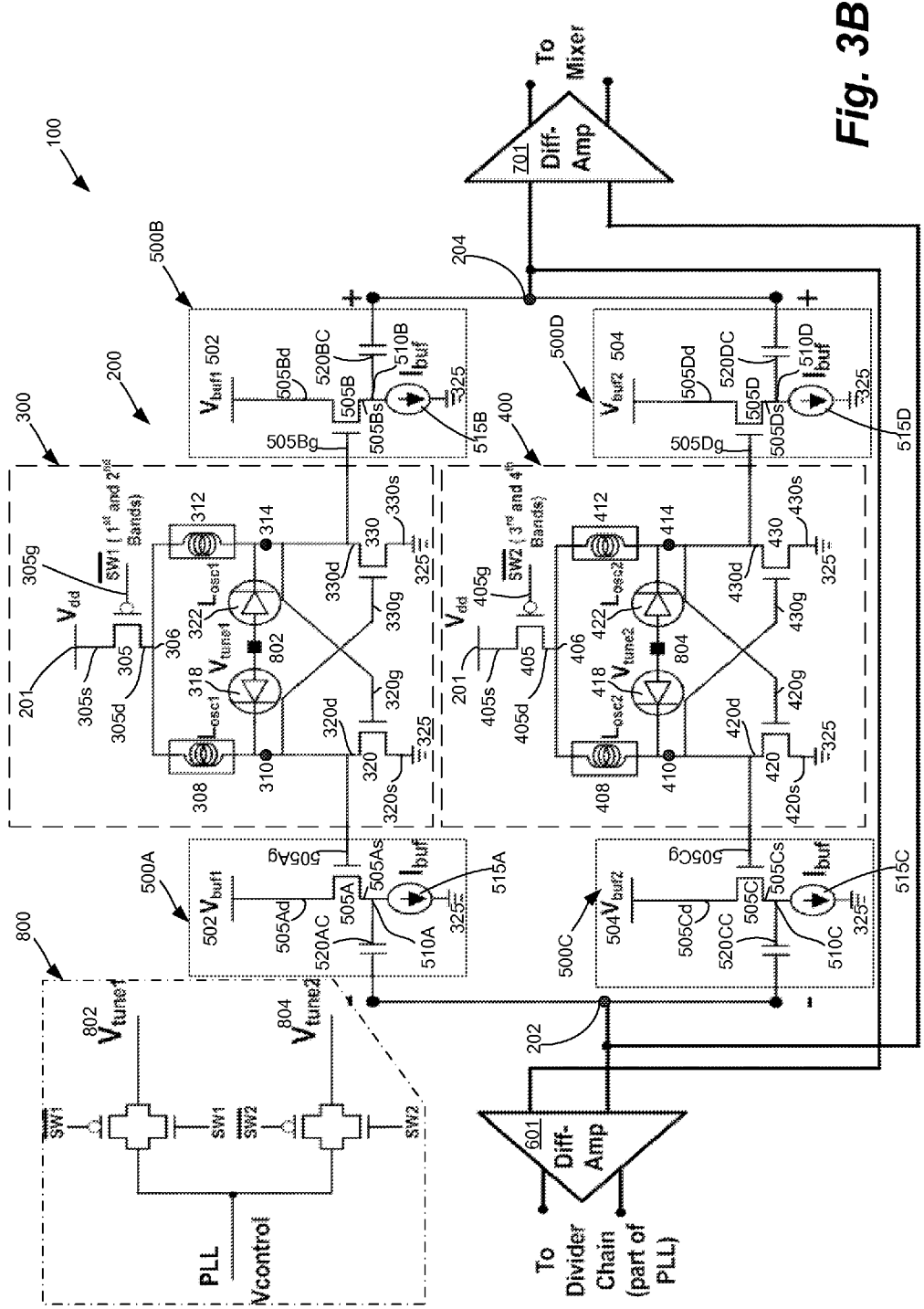
FIG. 3B is a schematic of a voltage control oscillator system, in accordance with an exemplary embodiment of the present invention.

The VCO system 200 is illustrated, exemplarily, in the schematic of FIG. 3B, which builds upon the block diagram of FIG. 3A by illustrating the exemplary components of the given systems. Generally, the VCO system 200 is a multi-band switched approach. The VCO system 200 implements four-channel architecture, such that two bands support two channels each. In an exemplary embodiment, the tuning line lengths of the cross-coupled VCO systems can be varied to obtain the desired frequency range.

In an exemplary embodiment, the targeted band is approximately 57-64 GHz. With an intermediate frequency (IF) fixed to approximately 8 GHz, local oscillator (LO) frequencies can be shifted to achieve different channels. Exemplarily, the LO frequency is approximately 49 to approximately 56 GHz. There may be a slight overlap of bands between two VCO systems. As for the PLL, a programmable divider can be used to obtain different LO frequencies, using the same reference frequency for the PLL. The switching controls are used in VCO power supplies and varactor controls for the VCO systems. To operate one of the VCO systems, the other one is preferably turned off, in order to avoid mixing. Power supply switching can be used to reduce the power consumption (e.g., in DC).

In an exemplary embodiment, and as illustrated in FIGS. 3A-3B, the VCO system 200 includes a first cross-coupled oscillator system 300, a second cross-coupled oscillator system 400, a plurality of isolation buffer systems 500, and a control circuit system 800.

Referring now to FIG. 3B, the first and second cross-coupled oscillator systems 300 and 400 can be used to generate signals at different bands. The tuning lengths of the inductors of these oscillator systems 300 and 400 can be derived from the analyses based on the measurement of the oscillators. In an exemplary embodiment, for reliable oscillation, the varactors are small, e.g., they have a varying capacitance of approximately 40-80 fF. The buffers systems 500 are used for isolating a pair of differential amplifiers, as well as isolating the cross-coupled oscillator systems 300 and 400. In addition, the buffer systems 500 eliminate the need for switches, which that are lossy at these frequencies, between the cross-coupled oscillators 300 and 400.

The first cross-coupled oscillator system 300 is positioned between a first isolation buffer system 500A and a second isolation buffer system 500B. The second cross-coupled oscillator system 400 is positioned between a third isolation buffer system 500C and a fourth isolation buffer system 500D. Isolation buffer systems 500B and 500D generate positive outputs and isolation buffer systems 500A and 500C generate negative outputs. The outputs from all four isolation buffer systems 500A, 500B, 500C and 500D are coupled to a differential amplifier 601, which is coupled to the PLL system 600, as well as to a differential amplifier 701, which is coupled to the mixer system 700.

More specifically, the first cross-coupled oscillator system 300 of the VCO system 200 contains at least two channels, i.e., the first and second channels. The first cross-coupled oscillator system 300 can receive the source voltage 201 (i.e., $V_{dd}$). The source voltage 201 is coupled to a transistor 305, which comprises a source 305s, a gate 305g, and a drain 305d. The source voltage 201 is fed to the source 305s of the transistor 305. The gate 305g is coupled to the control circuit system 800 (described more fully below), and the drain 305d is coupled to a first node 306. A first inductor 308 is positioned between the first node 306 and a second node 310. Additionally, a second inductor 312 is positioned between the first node 306 and a third node 314. A first varactor 318 is positioned between the second node 310 and a first tuning voltage 802 ($V_{tune1}$), provided by the control circuit system 800. A second varactor 322 is positioned between the third node 314 and the first tuning voltage $V_{tune1}$ 802.

The first cross-coupled oscillator system 300 further includes a second transistor 320 and a third transistor 330. The second transistor 320 comprises a source 320s, a gate 320g, and a drain 320d. Similarly, the third transistor 330 comprises a source 330s, a gate 330g, and a drain 330d. The drain 320d of the second transistor 320 is coupled to the second node 310. The drain 330d of the third transistor 330 is coupled to the third node 314. The gate 330g of the third transistor 330 is coupled to the second node 310. The gate 320g of the second transistor 320 is coupled to the third node 314. And the sources 320s and 330s are both coupled to a ground signal 325.

The drain 320d of the second transistor 320 is coupled to the first isolation buffer system 500A. The first isolation buffer system 500A includes a transistor 505A, which comprises a source 505As, a gate 505Ag, and a drain 505Ad. The drain 505Ad is coupled to a first voltage buffer source 502 ($V_{buf1}$). The gate 505Ag of the transistor 505A is coupled to the drain 320d of the second transistor 320 of the first cross-coupled oscillator system 300. The source 505As is coupled to a node 510A. A buffer current 515A ($I_{buf}$) can be coupled between the node 510A and ground 325. Further, a capacitor 520AC is coupled between the node 510A and a first output node 202.

The drain 330d of the third transistor 330 is coupled to the second isolation buffer system 500B. The second isolation buffer system 500B includes a transistor 505B, which comprises a source 505Bs, a gate 505Bg, and a drain 505Bd. The drain 505Bd is coupled to the first voltage buffer source 502 ($V_{buf1}$). The gate 505Bg of the transistor 505B is coupled to the drain 330d of the third transistor 330 of the first cross-coupled oscillator system 300. The source 505Bs is coupled to a node 510B. A buffer current 515B ($I_{buf}$) can be coupled between the node 510B and ground 325. In addition, a capacitor 520BC is coupled between the node 510B and a second output node 204.

The second cross-coupled oscillator system 400 of the VCO system 200 contains at least two channels, i.e., the third and fourth channels. The second cross-coupled oscillator system 400 can receive the source voltage 201 (i.e., $V_{dd}$). The source voltage 201 is coupled to a transistor 405, which comprises a source 405s, a gate 405g, and a drain 405d. The source voltage 201 is fed to the source 405s of the transistor 405. The gate 405g is coupled to the control circuit system 800 (described more fully below), and the drain 405d is coupled to a first node 406. A first inductor 408 is positioned between the first node 406 and a second node 410. In addition, a second inductor 412 is positioned between the first node 406 and a third node 414. A first varactor 418 is positioned between the second node 410 and a second tuning voltage 804 ($V_{tune2}$), provided by the control circuit system 800. A second varactor 422 is positioned between the third node 414 and the second tuning voltage $V_{tune2}$ 804.

The second cross-coupled oscillator system 400 further includes a second transistor 420 and a third transistor 430. The second transistor 420 comprises a source 420s, a gate 420g, and a drain 420d. Similarly, the third transistor 430 comprises a source 430s, a gate 430g, and a drain 430d. The drain 420d of the second transistor 420 is coupled to the second node 410. The drain 430d of the third transistor 430 is coupled to the third node 414. The gate 430g of the third transistor 430 is coupled to the second node 410. The gate 420g of the second transistor 420 is coupled to the third node 414. And the sources 420s and 430s are both coupled to ground signals 325.

The drain 420d of the second transistor 420 is coupled to the third isolation buffer system 500C. The third isolation buffer system 500C includes a transistor 505C, which comprises a source 505Cs, a gate 505Cg, and a drain 505Cd. The drain 505Cd is coupled to a second voltage buffer source 504 ($V_{buf2}$). The gate 505Cg of the transistor 505C is coupled to the drain 420d of the second transistor 420 of the second cross-coupled VCO system 400. The source 505Cs is coupled to a node 510C. A buffer current 515C ($I_{buf}$) can be coupled between the node 510C and ground 325. A capacitor 520CC is coupled between the node 510C and the first VCO output node 202.

The drain 430d of the third transistor 430 is coupled to the fourth isolation buffer system 500D. The fourth isolation buffer system 500D includes a transistor 505D, which comprises a source 505Ds, a gate 505Dg, and a drain 505Dd. The drain 505Dd is coupled to the second voltage buffer source 504 ($V_{buf2}$). The gate 505Dg of the transistor 505D is coupled to the source 430s of the third transistor 430 of the second cross-coupled VCO system 400. The source 505Ds is coupled to a node 510D. A buffer current 515D ($I_{buf}$) can be coupled between the node 510D and ground 325. A capacitor 520DC is coupled between the node 510D and the second VCO output node 204.

The output of buffer system 500A and the output of buffer system 500C are directly connected to one another. Similarly, the output of buffer system 500B and the output of buffer system 500D are directly connected to one another. As a result of these connections, the buffer systems 500 (i.e., 500A, 500B, 500C, and 500D) act to eliminate the need for switches between the cross-coupled oscillators 300 and 400.

Figure 4:
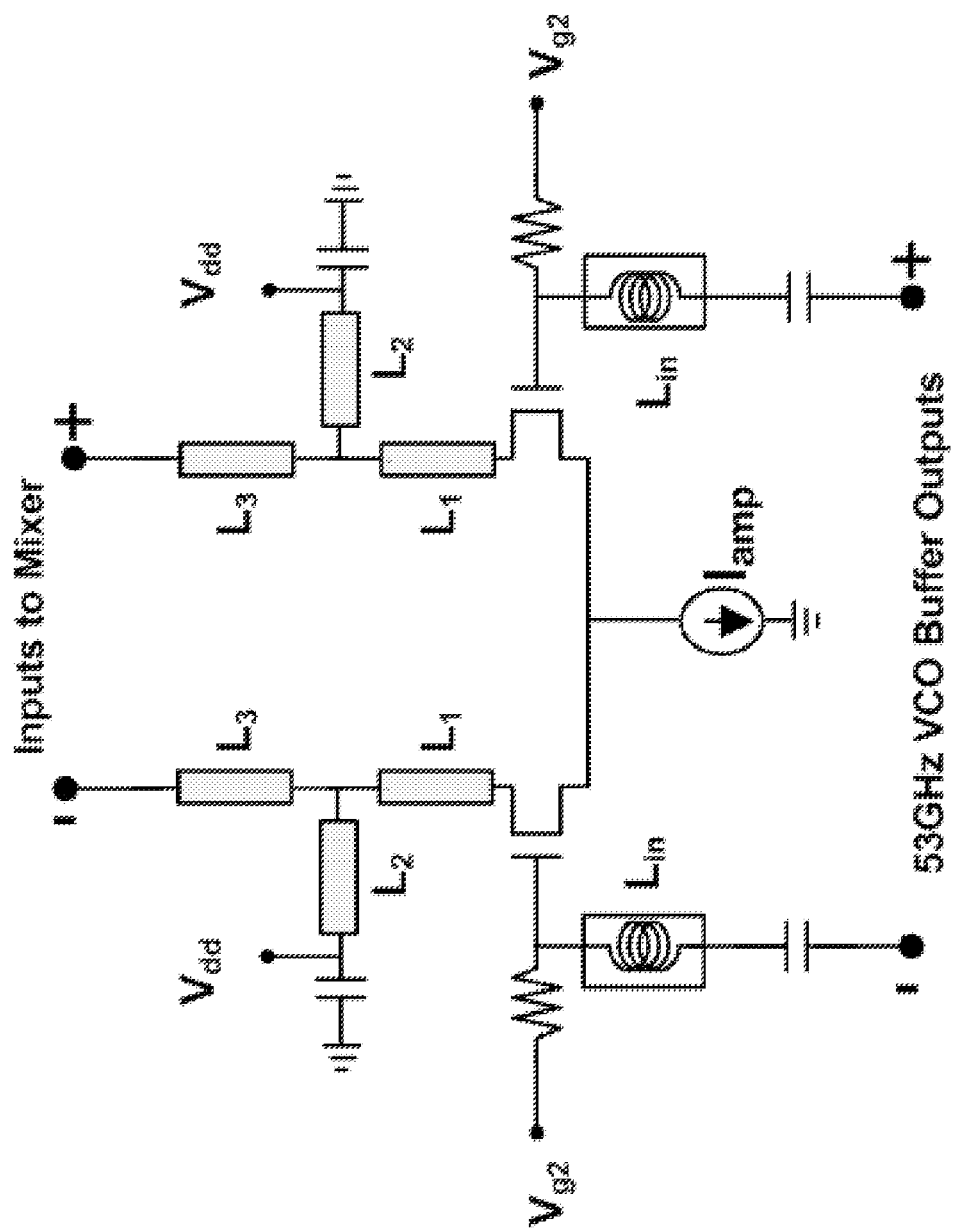
FIG. 4 is a schematic of a differential amplifier used in the VCO-PLL system, in accordance with an exemplary embodiment of the present invention.

The first VCO output node 202 and the second VCO output node 204 are coupled to both the differential amplifiers 601 and 701. That is, the buffer outputs 202 and 204 of the VCOs 300 and 400 are both fed to the differential amplifiers 601 and 701. The outputs are amplified in a different path before applying to an injection-locked divider (ILD). The input matching is simplified as an inductive line for compactness and higher bandwidth in matching. Stub matching networks, however, can also be used as the input. The output matching networks can be designed according to matching requirements for receiver and transmitter mixers, as well as layout constraints. An exemplary schematic of the differential amplifier (601 and/or 701) is shown in FIG. 4. In an exemplary embodiment, the power consumptions of the differential amplifiers 601 and 701 are approximately 9 mW and approximately 15 mW for receiver and transmitter, respectively. The power consumption of the differential amplifier at the input of ILD can be approximately 8 mW.

Figure 5:
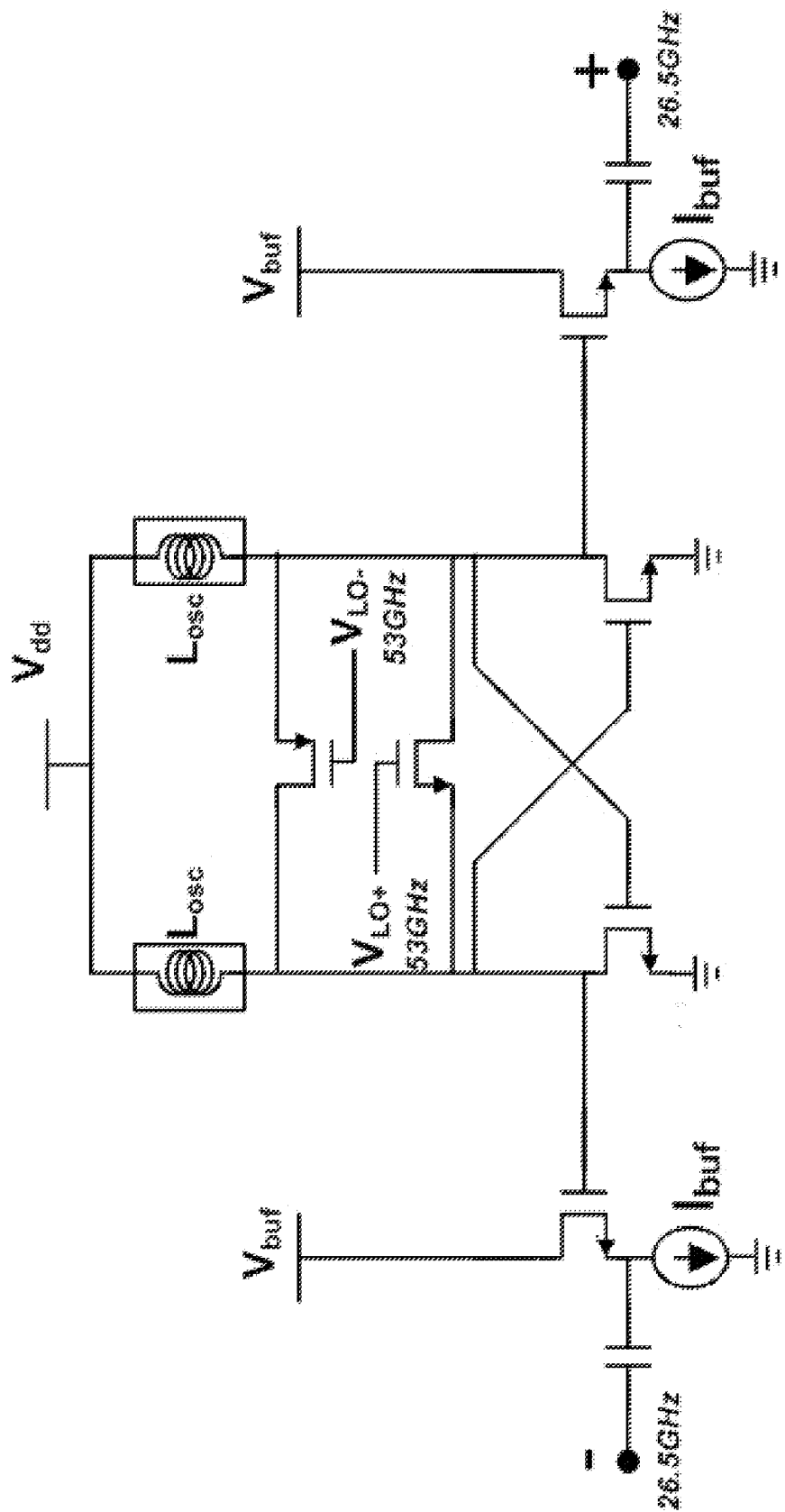
FIG. 5 is a schematic of an injection locked divider, in accordance with an exemplary embodiment of the present invention.

As shown in FIG. 5, the ILDs can be implemented using a cross-coupled configuration with free running frequency of approximately 26.5 GHz. The approximately 53 GHz differential signals can be injected on the oscillating nodes. Both NMOS and PMOS injections can be used. A bias network controls the DC-conditions for these injecting devices. A higher gate-to-source voltage difference can be used in PMOS, which obtains more injecting current and, hence, higher ranges of locking. The tuning lines can be simulated in Momentum, based on measurement results. Meander lines can be used to make the layout more compact. In fact, measurement results show that the locking range can be more than approximately 8 GHz.

Referring now back to FIGS. 2 and 3A-3B, the control circuit system 800 is coupled to the PLL system 600. A control voltage from the PLL system 600 is provided to the control circuit system 800. The control circuit system 800 permits switching between the two cross-coupled oscillator systems 300 and 400; this switching is controlled by a pair of transistors. Then, the particular tuning voltage, either $V_{tune1}$ 802 or $V_{tune2}$ 804 is provided to the predetermined VCO system 300 or 400.

Further, the control circuit system 800 includes switches that are implemented using PMOS switches with high breakdown voltages. The pass gates can include two switches, e.g., NMOS and PMOS. The pass gates are capable of driving a signal ranging from approximately 0 to approximately 1.8 Volts. De-coupling capacitors can be used after the tuning lines at the noted 306 and 406 (see FIG. 3B) to create a radio frequency (RF) ground and thus isolate the PMOS switches from the cross-coupled core for improved phase noise performance. The drop across the switches is reduced for given DC current consumption by using bigger devices with fingers. The pass gates can include two switches, i.e., NMOS and PMOS. To reduce the power consumption, nodes 502 and 306 for the first cross-coupled oscillator system 300 and nodes 504 and 406 for the second cross-coupled oscillator system 400 can be reduced. Also the buffer current $I_{buf}$ can be digitally controlled to provide isolation and to reduce the power consumption of the core in an off state.

Figure 6:
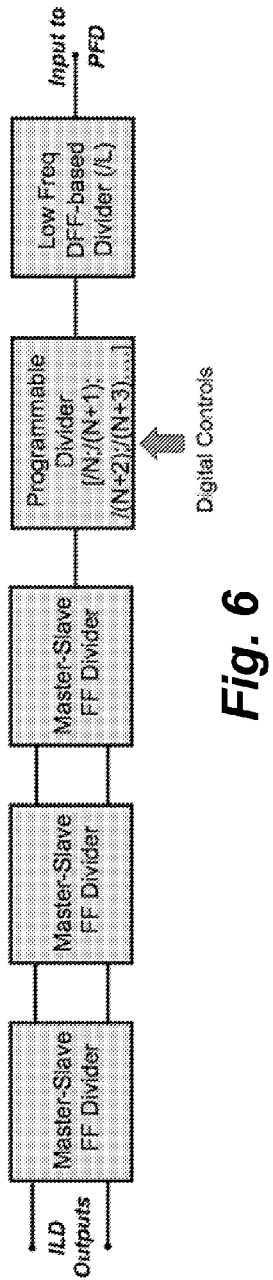
FIG. 6 is a block diagram of a programmable divider chain for the PLL, in accordance with an exemplary embodiment of the present invention.

FIG. 6 illustrates a block diagram of a programmable divider chain for the PLL system 600. Exemplarily, the first three stages use a D-type master-slave flip-flop-based divider. Resistive load can be used to achieve a higher range of divisions. A programmable divider can be implemented after the third master-slave divider. A multiplexer is used to control the division ratio. After that, a low frequency divider can be used to feed the phase frequency detector, as required. From FIG. 6, the division ratios achieved can be 8*L*N, 8*L*(N+1), 8*L*(N+2), 8*L*(N+3), and so on using digital controls. In an exemplary embodiment, the whole divider chain exhibits a power consumption of approximately 20 mW. For a less than approximately 200 mV amplitude input signal, this divider can divide frequencies ranging from approximately 18 GHz to 36 GHz.

Figure 8:
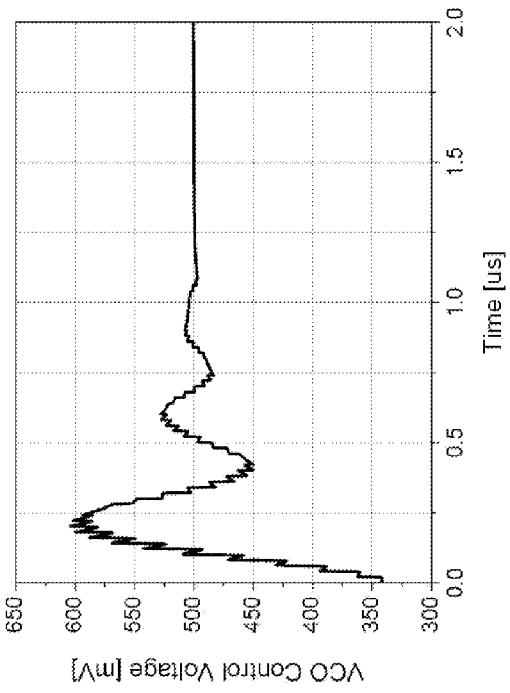
FIG. 8 is graphical representation of a control voltage for the PLL for 1 MHz reference frequency step, in accordance with an exemplary embodiment of the present invention.
Figure 7:
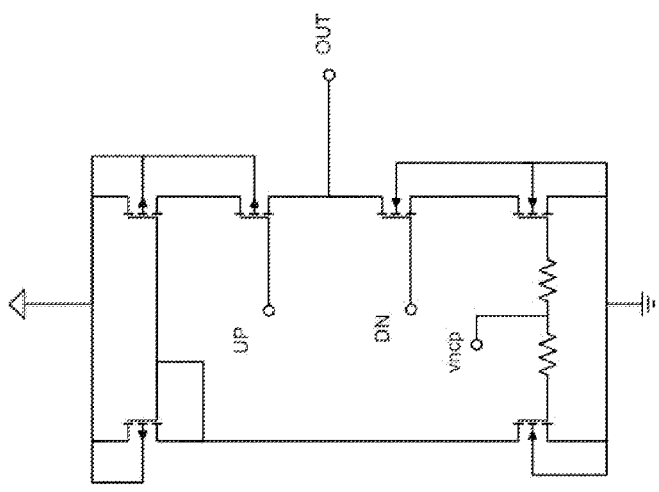
FIG. 7 is a schematic of a charge-pump, in accordance with an exemplary embodiment of the present invention.

FIG. 7 illustrates a schematic of a charge-pump. FIG. 8 illustrates graphical representation of a control voltage for the PLL for approximately 1 MHz reference frequency step. These generally include the PLL block, which include a phase frequency detector (PFD), a charge pump, and a loop filter. Exemplarily, the PFD can be implemented using the DFF-based (D-flip-flop) architecture. The charge pump can implement a conventional single-ended topology with enclosed biasing circuitry, particularly to the extent of controlling the output current by means of a single voltage input (vncp) as shown in FIG. 7. For example, this voltage can be used as the PLL on/off (PLLC) controls. The loop filter, on the other hand, can be implemented as a passive RC type. FIG. 8 shows the VCO control voltage for a frequency step of approximately 1 MHz of the reference frequency from approximately 52 MHz to approximately 53 MHz. The locking time is shown to be roughly equal to approximately 1.1 μs.

Figure 10:
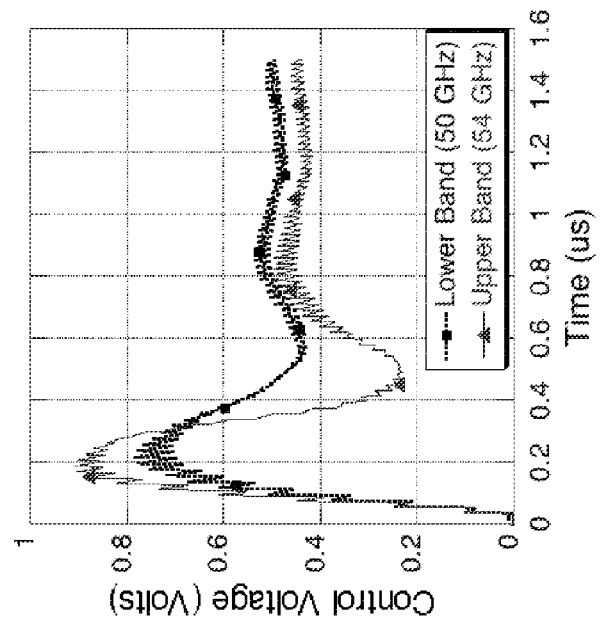
FIG. 10 is a graphical representation of locking characteristics of the VCO system, in accordance with an exemplary embodiment of the present invention.
Figure 9:
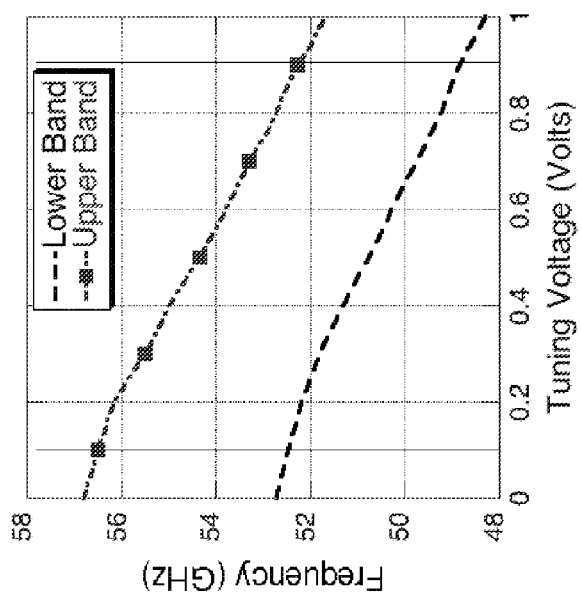
FIG. 9 is a graphical representation of simulated control characteristics of the VCO system, in accordance with an exemplary embodiment of the present invention.

FIG. 9 illustrates simulated control characteristics of the VCO system. FIG. 10 illustrates locking characteristics of the VCO system. A dual-band switching VCO can be implemented with a programmable divider of four different channel options in a standard 90 nm CMOS process. The identified bands given PLL output range being approximately 100 mV to approximately 900 mV are approximately 48.7 to approximately 52.6 GHz and approximately 52.4 to approximately 56.5 GHz. The total covered range is approximately 8 GHz. The PLL locking phenomenon can be demonstrated for two different frequencies: approximately 51 GHz and approximately 54 GHz. These two frequencies are in two different bands of the complete VCO system. The locking time (shown in FIG. 10) is approximately 1.3 μs.

Exemplary embodiments of the present invention provide high wide band VCO implementation that can be implemented in 90 nm CMOS technology, independent of performances of MOS switches at higher frequencies. Further, the use of large varactors is avoided and thus the phase noise performance of the multi-band VCO is improved over a single cross-coupled core with larger varactor. A cross-coupled VCO implementation has a higher output power than a push-push differential topology. And by using switches, the DC power reduces power consumption, especially when compared to a push-push oscillator.

In addition, the same topology can be used for more than two bands. Also, these bands can comprise as many channels as required given the programmability of the divider section. At around approximately 60 GHz or approximately 77 GHz, even a band as wide as approximately 20 GHz is ascertainable using this topology extending this topology to multiple cores.

Further, the described topology assures a better power consistency over frequency ranges. In a single cross-coupled core having larger varactor, the output power changes a lot with frequencies for large variation of capacitances. In the exemplary embodiment, each cross-coupled core works for a 2-4 GHz range and as a result the output power is more stable for the full band. More so, a part of the full range can be used by over-designing the oscillators.

In an exemplary embodiment, the design can overcome the wide band LO generation shortcomings of CMOS technologies in 60 GHz applications. At these frequencies, existing sub-10 GHz topologies do not apply well.

In an exemplary embodiment, the design can avoid the complexity of base-band circuitry by shifting the channel in LO scheme. Specifically, because the IF frequency is centered at the same frequency for the full band, it can reduce the challenges for designing broad band high-gain amplifiers in IF domain for super-heterodyne architectures.

In addition, in an exemplary embodiment, the design can be scalable in nature, i.e., the number of cross-coupled cores with an optimized layout can be used for a larger tuning range. In addition, this concept can also be utilized at many millimeter-wave frequencies.

Phase Locked Loop (PLL) Exemplary Embodiment

In another exemplary embodiment, a purpose of the presented programmable divider is to enable frequency-channel selection capability in a PLL frequency synthesizer system. A programmable divider in the feedback loop can be used, to obtain an output channel spacing equal to an integral multiple of the PLL input reference frequency. The maximum input frequency range for this device is up to approximately 5 GHz with approximately 7.14 mW power consumption, while the available division ratio ranges from 24 to 27 in unity steps.

Conventionally, the 7 GHz unlicensed band around approximately 60 GHz (in the U.S. the frequency range of approximately 57 to approximately 64 GHz is available) provides the possibility of multi-gigabit wireless transmissions and enables the implementation of various applications as Wireless-Local Area Networks (WLAN), Wireless-Personal Area Networks (WPAN), or Wireless-High Definition Multimedia Interface (WHDMI). The implementation of such transmit/receive or transceiver devices in a standard CMOS process has the advantage of cutting down the overall system cost with respect to more expensive silicon compound technologies, for example, such as silicon germanium (SiGe).

In the overall transceiver system architecture, frequency synthesis from a fixed reference frequency (i.e., from a crystal oscillator) is an essential building block. Because of the high frequency range involved, better noise performances and channel selection availability through loop division ratio modulation, PLL frequency synthesis is the natural choice for such an application. The implementation of channel selection requires programmable frequency dividers operating at high frequency. Moreover, hopping from one channel to an adjacent one involves unity steps in the division ratio, therefore excluding, at least for some channels, conventional T-FF $2^n$ dividers. For a 60 GHz application, the very first frequency division (e.g., down to approximately 30 GHz) is usually implemented through an ILD and the subsequent fixed division ratio dividers can be implemented using a dynamic master-slave topology. At the end of this chain, the programmable frequency divider can be placed with less stringent maximum operating frequency requirements. This frequency scaling technique causes the minimum output frequency step to be wider than the input reference frequency by a factor equal to the fixed division ratio chain. Though the channel spacing in the 60 GHz band is in the order of approximately 2 GHz, the use of input reference frequency in the order of tens of MHz can facilitate achieving a fixed division ratio up to approximately 80-100.

FIGS. 11-20 illustrate general building blocks that can be implemented for the PLL system 600.

FIG. 11 illustrates a block diagram of a programmable frequency divider system. As can be seen FIG. 11, the divider comprises four fixed division ratio chains ranging from 24 to 27. The desired output frequency can be then selected through a four to one output multiplexer using two control bits (A and B). The implementation of this architecture can be based on the synthesis of each divider chain and the design of each divider block. An exemplary number of desired divider blocks is five, e.g., divide-by-2 (FIG. 12A), divide-by-8 (FIG. 12B), divide-by-3 (FIG. 13), divide-by-5 (FIG. 15) and divide-by-13 (FIG. 17).

FIG. 12A illustrates a schematic of a toggle flip-flop for a divide-by-2 divider circuit, while FIG. 12B illustrates a schematic of a cascaded toggle flip-flop divide-by-8 divider circuit. The divide-by-2 block (see FIG. 12A) can be implemented by a simple toggle flip-flop (T-FF), while the divide-by-8 block (see FIG. 12B) (as can be done for 2" dividers) can be implemented by cascading three divide-by-2 blocks.

Figure 13:
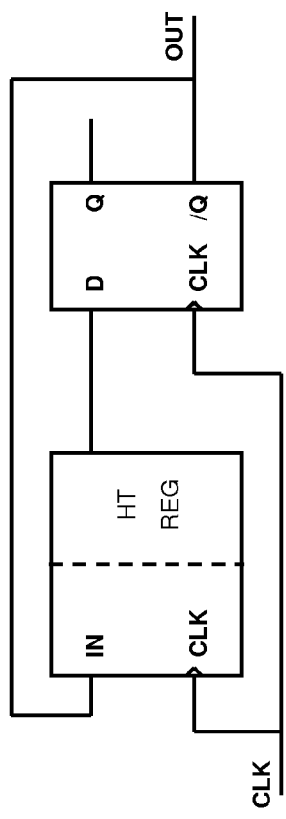
FIG. 13 is a schematic of a toggle flip-flop for a divide-by-3 divider circuit, in accordance with an exemplary embodiment of the present invention.
Figure 14:
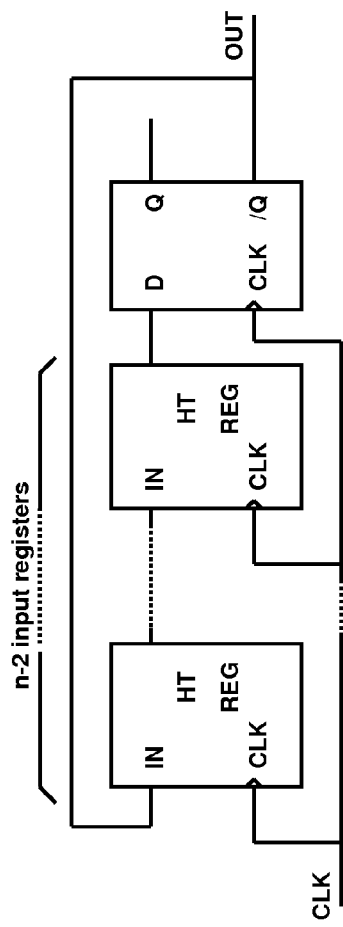
FIG. 14 is a schematic of a toggle flip-flop for divide-by-N divider, in accordance with an exemplary embodiment of the present invention.

FIG. 13 illustrates a schematic of a toggle flip-flop for a divide-by-3 divider circuit. FIG. 14 illustrates a schematic of a toggle flip-flop for divide-by-N divider circuit. The odd division ratio can be obtained by placing a variable delay in the feedback loop. The delay is dependent on the input value of the half-transparent register that is transparent when its input is a logic 1 and positive edge-triggered with respect to a logic 0 input. This way the output signal can be logic 1 for one period of the input clock and logic 0 for two input clock cycles. The divide-by-5 circuit can be implemented generalizing the above architecture placing additional input registers, as shown in FIG. 14.

Figure 15:
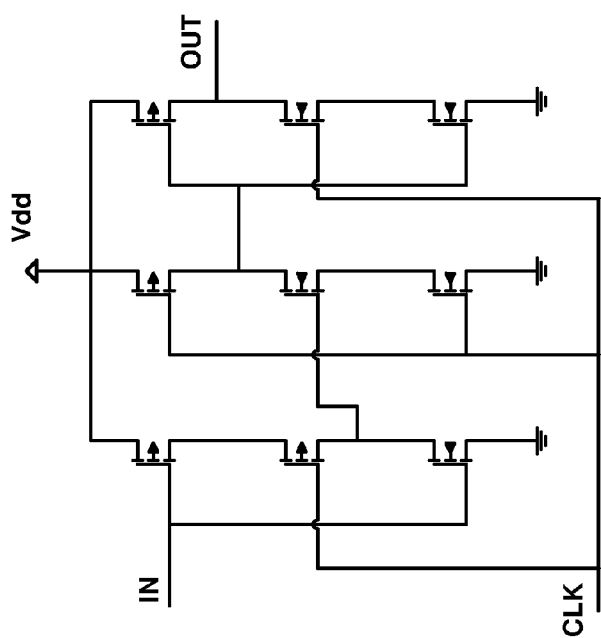
FIG. 15 is a schematic of a D-flip-flop for divide-by-3 and divide-by-5 circuits, in accordance with an exemplary embodiment of the present invention.
Figure 16:
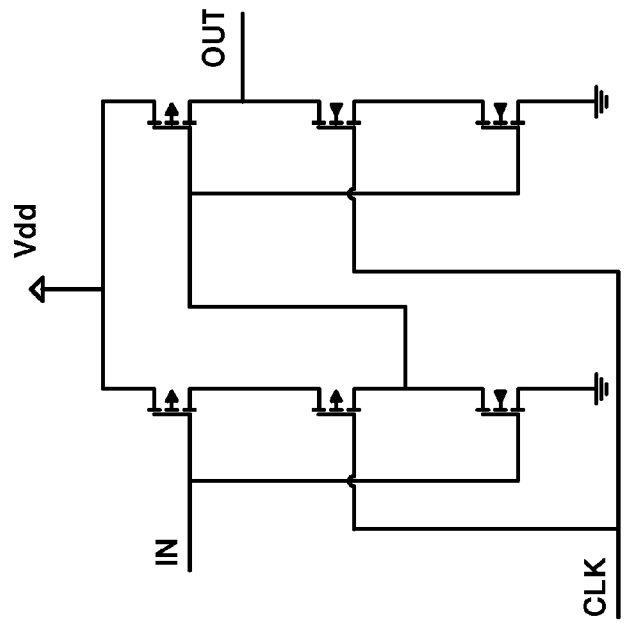
FIG. 16 is a schematic of a half-transparent register circuit design, in accordance with an exemplary embodiment of the present invention.
Figure 17:
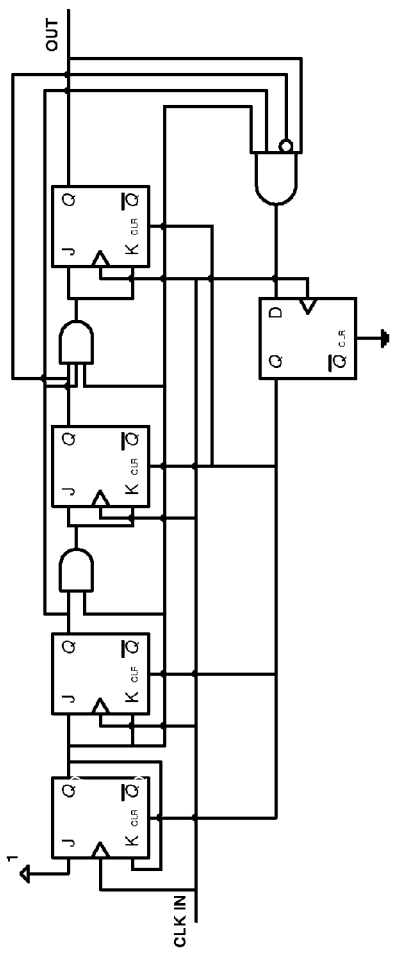
FIG. 17 is a schematic of a divide-by-13 divider circuit, in accordance with an exemplary embodiment of the present invention.

Referring now to FIGS. 15-17, FIG. 15 illustrates a D-flip-flop for divide-by-3 and divide-by-5 circuits and FIG. 16 illustrates a half-transparent register circuit design. As for FIG. 17, a divide-by-13 divider circuit is illustrated and is implemented using a synchronous JK-flip-flop architecture with a clocked reset.

Generally, this divider has been implemented trying to minimize series connections between logic gates to the extent of minimizing the total delay to generate the synchronous reset. The maximum operating frequency for this divider can be set by the time needed to reset the counter once the counting sequence reaches 12 (because it starts at 0). To avoid critical races issues, the reset signal is synchronized using a D-FF clocked with the input clock signal.

Figure 18:
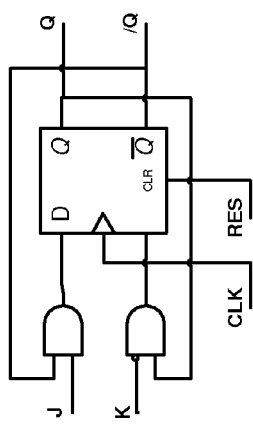
FIG. 18 is a schematic of a JK-flip-flop using the same D-flip-flop of the divide-by-2 circuit of FIG. 12A and the divide-by-8 circuit of FIG. 12B, in accordance with an exemplary embodiment of the present invention.

As shown in FIG. 18, the JK-flip-flop can be implemented using the same D-flip-flop of the divide-by-2 circuit and the divide-by-8 circuits.

Figure 19:
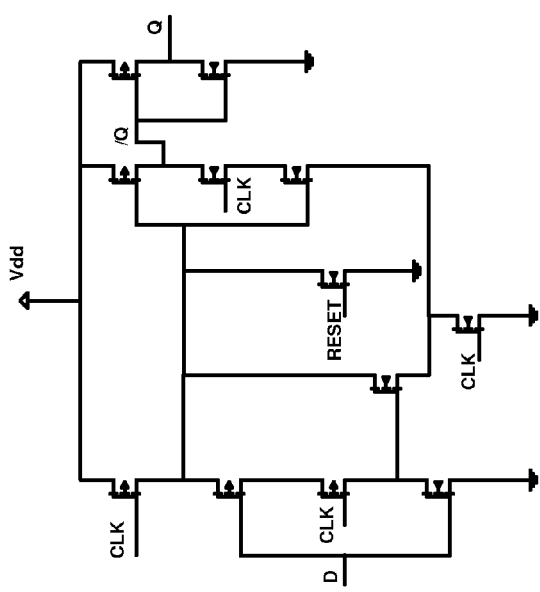
FIG. 19 is a schematic of a transistor level D-flip-flop, in accordance with an exemplary embodiment of the present invention.

As shown in FIG. 19, the transistor-level D-flip-flop can be implemented with a fast RESET signal.

Figure 20:
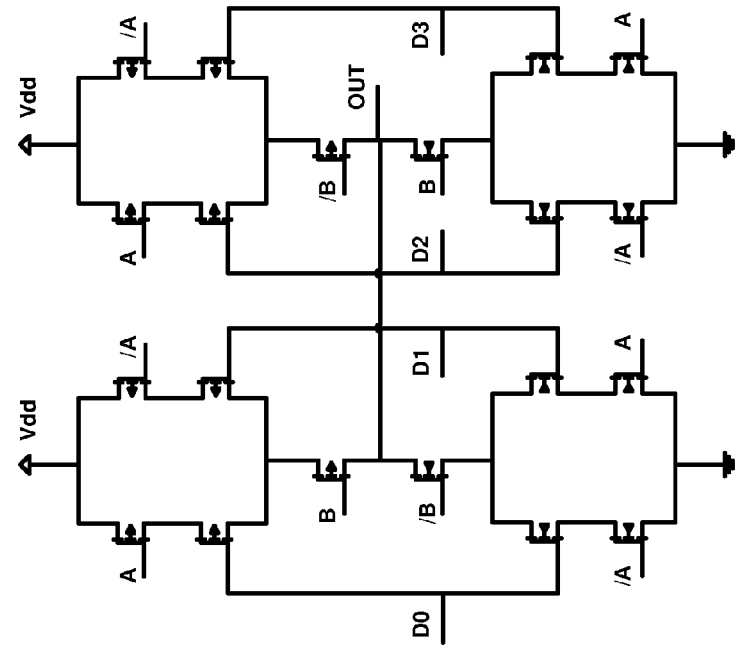
FIG. 20 is a schematic of a multiplexer, in accordance with an exemplary embodiment of the present invention.

The output multiplexer preferably selects the desired division ratio. Implementation of this is shown in FIG. 20.

In this approach, the PLL represents a trade-off between dynamic charge-sharing logic dividers and a purely static architecture offering higher maximum speed of operations with respect to previously published dividers and obtaining a much lower overall power consumption for the complete programmable divider.

The addition of a fast reset implementation in the evaluation stage of the dynamic D-FF (FIG. 9) allows higher speed reset in the divide-by-13 divider compared with traditional static D-FF designs.

The implemented architecture can be modular and therefore easily expandable. For example, addition of new frequency division ratios and/or output channels can be done by adding the required divider chains and setting the needed number of control bits to the output multiplexer.

Because the presented programmable frequency divider is suited for PLL applications, 50% output frequency duty-cycle is not required for the edge-triggered logic implemented in most phase-frequency detectors (PFDs). In fact, this allows the simplification of the divider architecture and allows for higher maximum operating frequencies.

Further, power consumption can be reduced, without any maximum speed degradation, by switching off the unused divider chains when the desired one is selected by the output multiplexer.

Because the maximum bandwidth for standard CMOS implementations is in the order of approximately 5-8% of the 60 GHz center frequency, channel switching capability is desired to exploit the entirety of the 7 GHz frequency spectrum. Moreover, recent developments in the standard definition (i.e., IEEE 802.15 working group for WPAN) set the channel bandwidth to be in the order of 2 GHz, thus requiring a channel selection implementation in a multiplexed operational environment.

While embodiments of the invention have been disclosed in its preferred forms, it will be apparent to those skilled in the art that many modifications, additions, and deletions can be made therein without departing from the spirit and scope of the invention and its equivalents, as set forth in the following claims.

What is claimed is:

1. A voltage controlled oscillator-phase lock loop (VCO-PLL) system comprising:
    a voltage controlled oscillator (VCO) system comprising:
        a control circuit;
        a first cross-coupled oscillator system adapted to receive a source voltage, the first cross-coupled oscillator system comprising:
            a first transistor comprising a first source, a first gate, and a first drain, the first source coupled to the source voltage, the first gate coupled to the control circuit;
            a first inductor comprising a first end and a second end, the first end coupled to the first drain of the first transistor, and the second end coupled to a first node;
            a second inductor comprising a first end and a second end, the first end coupled to the first drain of the first transistor, and the second end coupled to a second node;
            a first varactor coupled between the first node and a first tuning voltage controlled by the control circuit;
            a second varactor coupled between the second node and the first tuning voltage controlled by the control circuit;
            a second transistor comprising a second source, a second gate, and a second drain, the second drain coupled to the first node, the second gate coupled the second node, and the second source coupled to a ground signal; and
            a third transistor comprising a third source, a third gate, and a third drain, the third drain coupled to the second node, the third gate coupled the first node, and the third source coupled to the ground signal;

a second cross-coupled oscillator system adapted to receive the source voltage, the second cross-coupled oscillator system comprising:

a fourth transistor comprising a fourth source, a fourth gate, and a fourth drain, the fourth source coupled to the source voltage, the fourth gate coupled to the control circuit;

a third inductor comprising a first end and a second end, the first end coupled to the fourth drain of the fourth transistor, and the second end coupled to a third node;

a fourth inductor comprising a first end and a second end, the first end coupled to the fourth drain of the fourth transistor, and the second end coupled to a fourth node;

a third varactor coupled between the third node and a second tuning voltage controlled by the control circuit;

a fourth varactor coupled between the fourth node and the second tuning voltage controlled by the control circuit;

a fifth transistor comprising a fifth source, a fifth gate, and a fifth drain, the fifth drain coupled to the third node, the fifth gate coupled the fourth node, and the fifth source coupled to the ground signal; and a sixth transistor comprising a sixth source, a sixth gate, and a sixth drain, the sixth drain coupled to the fourth node, the sixth gate coupled the third node, and the sixth source coupled to the ground signal; and a phase-locked-loop (PLL) system; and a mixer system.

2. The VCO-PLL system of claim 1, further comprising a plurality of isolation buffer systems adapted to protect the first and second cross-coupled oscillator systems, wherein each of the plurality of isolation buffer systems comprising:

a buffer transistor comprising a buffer transistor source, a buffer transistor gate, and a buffer transistor drain, the buffer transistor drain coupled to a buffer voltage, the buffer transistor gate coupled to the drain of one of the second, third, fifth, or sixth transistors; and a buffer capacitor coupled between the buffer transistor source and an output of the isolation buffer system.

3. The VCO-PLL system of claim 2, further comprising:

a first isolation buffer system the first isolation buffer system comprising:

a first buffer transistor comprising a first buffer transistor source, a first buffer transistor gate, and a first buffer transistor drain, the first buffer transistor drain coupled to a first buffer voltage, the first buffer transistor gate coupled to the second drain of the second transistor of the first cross-coupled oscillator system; and a first buffer capacitor coupled between the first buffer transistor source and a first output;

a second isolation buffer system the second isolation buffer system comprising:

a second buffer transistor comprising a second buffer transistor source, a second buffer transistor gate, and a second buffer transistor drain, the second buffer transistor drain coupled to the first buffer voltage, the second buffer transistor gate coupled to the third drain of the third transistor of the first cross-coupled oscillator system; and a second buffer capacitor coupled between the second buffer transistor source and a second output;

a third isolation buffer system the third isolation buffer system comprising:

a third buffer transistor comprising a third buffer transistor source, a third buffer transistor gate, and a third buffer transistor drain, the third buffer transistor drain coupled to a second buffer voltage, the third buffer transistor gate coupled to the fifth drain of the fifth transistor of the second cross-coupled oscillator system; and a third buffer capacitor coupled between the third buffer transistor source and a third output; and a fourth isolation buffer system, the fourth isolation buffer system comprising:

a fourth buffer transistor comprising a fourth buffer transistor source, a fourth buffer transistor gate, and a fourth buffer transistor drain, the fourth buffer transistor drain coupled to the second buffer voltage, the fourth buffer transistor gate coupled to the sixth drain of the sixth transistor of the second cross-coupled oscillator system; and a fourth buffer capacitor coupled between the fourth buffer transistor source and a fourth output.

4. The VCO-PLL system of claim 3, wherein the first, second, third, and fourth buffer systems are coupled to one another, and wherein the first output of the first isolation buffer system is coupled to the third output of the third isolation buffer system absent additional, external circuitry; and the second output of the second isolation buffer system is coupled to the fourth output of the fourth isolation buffer system absent additional, external circuitry.

5. The VCO-PLL system of claim 2, each of the plurality of isolation buffer systems further comprising a buffer current positioned between the buffer transistor source of the buffer transistor and the ground signal.

6. The VCO-PLL system of claim 2, the control circuit adapted to control the first cross-coupled oscillator system and the second cross-coupled oscillator system, such that wherein the control circuit enables switching on and off the first and second cross-coupled oscillator systems, wherein when one cross-coupled oscillator system is on the other is off.

7. The VCO-PLL system of claim 2, the VCO system comprising a multi-band switched design absent external circuitry for combining multi-band outputs.

8. The VCO-PLL system of claim 2, the VCO system implementing four-channels operating at millimeter wave frequencies, wherein each VCO system supports two channels each.

9. A voltage controlled oscillator-phase lock loop (VCO-PLL) system comprising:

a control circuit;

a voltage controlled oscillator (VCO) system implementing a four-channel architecture configured to operate at millimeter wave frequencies, wherein two bands support two channels each, the VCO system comprising:

a first cross-coupled oscillator system adapted to receive a source voltage; the first cross-coupled oscillator system comprising:

a first transistor comprising a first source, a first gate, and a first drain, the first source coupled to a source voltage, the first gate coupled to a control circuit;

a first inductor coupled at a first end to the first drain of the first transistor;

a second inductor coupled at a first end to the first drain of the first transistor;
a first varactor coupled between the second end of the first inductor and a first tuning voltage controlled by the control circuit;
a second varactor coupled between the second end of the second transistor and the first tuning voltage controlled by the control circuit;
a second transistor comprising a second source, a second gate, and a second drain, the second drain coupled to the second end of the first inductor, the second gate coupled the second end of the second inductor, and the second source coupled to a ground signal; and
a third transistor comprising a third source, a third gate, and a third drain, the third drain coupled to the second end of the second inductor, the third gate coupled the second end of the first inductor, and the third source coupled to the ground signal;
a second cross-coupled oscillator system adapted to receive the source voltage, the second cross-coupled oscillator system comprising:
a fourth transistor comprising a fourth source, a fourth gate, and a fourth drain, the fourth source coupled to the source voltage, the fourth gate coupled to the control circuit;
a third inductor coupled at a first end to the fourth drain of the fourth transistor;
a fourth inductor coupled at a first end to the fourth drain of the fourth transistor;
a third varactor coupled between the second end of the third inductor and a second tuning voltage controlled by the control circuit;
a fourth varactor coupled between the second end of the fourth inductor and the second tuning voltage controlled by the control circuit;
a fifth transistor comprising a fifth source, a fifth gate, and a fifth drain, the fifth drain coupled to the second end of the third inductor, the fifth gate coupled the second end of the fourth inductor, and the fifth source coupled to the ground signal; and
a sixth transistor comprising a sixth source, a sixth gate, and a sixth drain, the sixth drain coupled to the second end of the fourth inductor, the sixth gate coupled the second end of the third inductor, and the sixth source coupled to the ground signal; and
a first isolation buffer system adapted to protect the first cross-coupled oscillator system, the first isolation buffer system generates a first buffer output, the first isolation buffer system comprising:
a first buffer transistor comprising a first buffer transistor source, a first buffer transistor gate, and a first buffer transistor drain, the first buffer transistor drain coupled to a first buffer voltage, the first buffer transistor gate coupled to the second drain of the second transistor of the first cross-coupled oscillator system; and
a first buffer capacitor coupled between the first buffer transistor source and the first buffer output;
a second isolation buffer system adapted to protect the first cross-coupled oscillator system, the second isolation buffer system generates a second buffer output, the second isolation buffer system comprising:
a second buffer transistor comprising a second buffer transistor source, a second buffer transistor gate, and a second buffer transistor drain, the second buffer transistor drain coupled to the first buffer voltage, the second buffer transistor gate coupled to the third drain of the third transistor of the first cross-coupled oscillator system; and
a second buffer capacitor coupled between the second buffer transistor source and the second buffer output;
a third isolation buffer system adapted to protect the second cross-coupled oscillator system, the third isolation buffer system generates a third buffer output, the third isolation buffer system comprising:
a third buffer transistor comprising a third buffer transistor source, a third buffer transistor gate, and a third buffer transistor drain, the third buffer transistor drain coupled to a second buffer voltage, the third buffer transistor gate coupled to the fifth drain of the fifth transistor of the second cross-coupled oscillator system; and
a third buffer capacitor coupled between the third buffer transistor source and the third buffer output.
a fourth isolation buffer system adapted to protect the second cross-coupled oscillator system, the fourth isolation buffer system generates a fourth buffer output, the fourth isolation buffer system comprising:
a fourth buffer transistor comprising a fourth buffer transistor source, a fourth buffer transistor gate, and a fourth buffer transistor drain, the fourth buffer transistor drain coupled to the second buffer voltage, the fourth buffer transistor gate coupled to the sixth drain of the sixth transistor of the second cross-coupled oscillator system; and
a fourth buffer capacitor coupled between the fourth buffer transistor source and the fourth buffer output;
a phase-locked-loop (PLL) system; and
a mixer system,
wherein the first buffer output of the first isolation buffer system is coupled to the third buffer output of the third isolation buffer system; and
wherein the second buffer output of the third isolation buffer system is coupled to the fourth buffer output of the fourth isolation buffer system.

10. The VCO-PLL system of claim 9, further comprising:
a first differential amplifier and a second differential amplifier each coupled to the first, second, third and fourth buffer outputs of the first, second, third, and fourth isolation buffer systems;
the first differential amplifier coupled to the PLL system; and
the second differential amplifier coupled to the mixer system.

11. The VCO-PLL system of claim 9, the VCO system comprising a multi-band switched design absent external circuitry for combining multi-band outputs.

12. The VCO-PLL system of claim 9, each of the first, second, third, and fourth isolation buffer systems further comprising a buffer current positioned between its respective buffer transistor source and the ground signal.

13. The VCO-PLL system of claim 9, the control circuit adapted to control the first cross-coupled oscillator system and the second cross-coupled oscillator system, such that the control circuit enables switching on and off the first and second cross-coupled oscillator systems, wherein when one cross-coupled oscillator system is on the other is off.

14. The VCO-PLL system of claim 2, the PLL system configured to independently control the first cross-coupled oscillator system and the second cross-coupled oscillator system of the VCO system.

15. The VCO-PLL system of claim 1, further comprising:
a first isolation buffer system comprising a first buffer transistor, the first buffer transistor comprising a first buffer transistor gate coupled to the second drain of the second transistor of the first cross-coupled oscillator system;
a second isolation buffer system comprising a second buffer transistor, the second buffer transistor comprising a second buffer transistor gate coupled to the third drain of the third transistor of the first cross-coupled oscillator system;
a third isolation buffer system comprising a third buffer transistor, the third buffer transistor comprising a third buffer transistor gate coupled to the fifth drain of the fifth transistor of the second cross-coupled oscillator system; and
a fourth isolation buffer system comprising a fourth buffer transistor, the fourth buffer transistor comprising a fourth buffer transistor gate coupled to the sixth drain of the sixth transistor of the second cross-coupled oscillator system.

16. The VCO-PLL system of claim 3, wherein the control circuit is adapted to control the first cross-coupled oscillator system and a buffer current of the first and second isolation buffer systems together, and the second cross-coupled oscillator system with a buffer current of the third and fourth isolation buffer systems together, wherein the control circuit enables switching on and off the first and second cross-coupled oscillator systems along with their corresponding isolation buffer systems, such that when one cross-coupled oscillator system is ON the other is OFF.

17. The VCO-PLL system of claim 3, wherein the first and second isolation buffers provide high impedances to the third and fourth isolation buffer systems when the first cross-coupled oscillator system and the first and second isolation buffer currents are in an OFF state, and wherein the third and fourth isolation buffers provide high impedances to the first and second isolation buffer systems when the second cross-coupled oscillator system and the third and fourth isolation buffer current are in an OFF state.

* * * * *